(12) United States Patent
Hong et al.

(10) Patent No.: US 9,606,404 B2
(45) Date of Patent: Mar. 28, 2017

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Sung Hee Hong, Hwaseong-si (KR); Jang-Il Kim, Asan-si (KR); Un Byoll Ko, Yeoju-si (KR); Sei-Yong Park, Suwon-si (KR); Jung Wook Lee, Anyang-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 33 days.

(21) Appl. No.: 14/793,832

(22) Filed: Jul. 8, 2015

(65) Prior Publication Data

US 2016/0202580 A1    Jul. 14, 2016

(30) Foreign Application Priority Data

Jan. 9, 2015   (KR) ........................ 10-2015-0003674

(51) Int. Cl.

| G02F 1/136 | (2006.01) |
|---|---|
| G02F 1/1362 | (2006.01) |
| G02F 1/1368 | (2006.01) |
| G02F 1/1333 | (2006.01) |
| H01L 27/12 | (2006.01) |

(52) U.S. Cl.
CPC ...... *G02F 1/136227* (2013.01); *G02F 1/1368* (2013.01); *G02F 1/133345* (2013.01); *G02F 1/136286* (2013.01); *H01L 27/124* (2013.01); *G02F 1/13624* (2013.01); *G02F 2001/136222* (2013.01); *G02F 2001/136295* (2013.01)

(58) Field of Classification Search
CPC ..................... G02F 1/13624; G02F 1/136227
See application file for complete search history.

(56) References Cited

U.S. PATENT DOCUMENTS

| 2010/0066966 A1* | 3/2010 | Matsuda ............. G02F 1/13394 349/143 |
|---|---|---|
| 2010/0148176 A1* | 6/2010 | Son ................... G02F 1/133514 257/59 |
| 2015/0109554 A1* | 4/2015 | Lee ....................... H01L 27/124 349/48 |

FOREIGN PATENT DOCUMENTS

| KR | 1020000066397 A | 11/2000 |
|---|---|---|
| KR | 1020050014060 A | 2/2005 |
| KR | 1020130011794 A | 1/2013 |
| KR | 1020140056862 A | 5/2014 |
| KR | 1020140074479 A | 6/2014 |

* cited by examiner

*Primary Examiner* — Phu Vu
*Assistant Examiner* — John Bodnar
(74) *Attorney, Agent, or Firm* — Cantor Colburn LLP

(57) ABSTRACT

A liquid crystal display includes: a first substrate; a gate line on the first substrate; a first switching element connected to the gate line, to which a data voltage is applied; a first pixel electrode connected to the first switching element; and a color filter between the first switching element and the first pixel electrode, in which is defined: two contact holes spaced apart from each other, and a connecting portion connecting the spaced apart two contact holes to each other. The first pixel electrode is connected to the first switching element via a first contact hole among the spaced apart two contact holes.

14 Claims, 8 Drawing Sheets

LIQUID CRYSTAL DISPLAY AND METHOD OF MANUFACTURING THE SAME

This application claims priority to Korean Patent Application No. 10-2015-0003674 filed on Jan. 9, 2015, and all the benefits accruing therefrom under 35 U.S.C. §119, the entire contents of which are incorporated herein by reference.

BACKGROUND (a) Field

The invention relates to a liquid crystal display and method of manufacturing the same.

(b) Description of the Related Art

A liquid crystal display is one of the most widely used flat panel displays. The liquid crystal display is a display device that includes two sheets of display panels in which electrodes are disposed, and a liquid crystal layer interposed between the two sheets of display panels. A voltage applied to the electrodes to rearrange liquid crystal molecules of a liquid crystal layer adjusts an amount of light transmitted therethrough.

Among the structures of the above-mentioned liquid crystal display, a plurality of thin film transistors and pixel electrodes may be arranged in matrix form in one among the two display panels, and color filters such as red, green and blue color filters may be arranged in the other among the two display panels. Since the pixel electrodes and the color filters are disposed on different display panels, accurately aligning the pixel electrodes and the color filters may be difficult, thereby causing alignment error within the liquid crystal display. In order to reduce or effectively prevent misalignment of the pixel electrodes and the color filters, a color filter on array ("COA") structure in which the color filters and the pixel electrodes are arranged in a same single display panel has been proposed.

SUMMARY

In both a liquid crystal display including two separate display panels and a liquid crystal display including a color filter on array ("COA") structure for which the color filters and the pixel electrodes are arranged in a same display panel, contact holes having various purposes are defined in the color filters. Transmittance of the liquid crystal display is directly affected by a size and/or an arrangement of the contact holes. Therefore, there remains a desire to decrease the size of the contact holes in consideration of a method of forming the contact holes with respect to a material property of materials used in forming the color filters.

One or more exemplary embodiment of the invention provides a liquid crystal display and a method of manufacturing the same having advantages of contact holes which are formed having a minimal or reduced size in consideration of a material property of the material used in forming a color filter to thereby improve an aperture ratio of the liquid crystal display.

An exemplary embodiment of the invention provides a liquid crystal display including: a first substrate; a gate line on the first substrate; a first switching element connected to the gate line, to which a data voltage is applied; a first pixel electrode connected to the first switching element; and a color filter between the first switching element and the first pixel electrode, in which is defined: two contact holes spaced apart from each other, and a connecting portion connecting the spaced apart two contact holes to each other.

The first pixel electrode is connected to the first switching element via a first contact hole among the spaced apart two contact holes.

A width of each of the spaced apart two contact holes may be greater than about 5 micrometers to less than about 12.5 micrometers.

An interval between the spaced apart two contact holes may be greater than 0 micrometer to less than about 10 micrometers.

The liquid crystal display may further include: a second switching element applied with the same data voltage as that applied to the first switching element; and a second pixel electrode connected to the second switching element. The second pixel electrode may be connected to the second switching element via a second contact hole different from the first contact hole among the spaced apart two contact holes.

The liquid crystal display may further include: a third switching element connected to the second switching element; a voltage wiring connected to the third switching element; and a third contact hole different from the first and second contact holes, defined in the color filter and spaced apart from the spaced apart first and second contact holes. The third switching element may be connected to the voltage wiring via the third contact hole spaced apart from the spaced apart first and second contact holes, the first to third contact holes may be arranged in a line, and the connecting member may further connect the linearly arranged spaced apart first to third contact holes to each other.

A width of each of the spaced apart first to third contact holes may be greater than about 5 micrometers to less than about 12.5 micrometers.

An interval between adjacent contact holes among the spaced apart first to third contact holes may be greater than 0 micrometer to less than about 10 micrometers.

The liquid crystal display may further include a common electrode overlapped with the first pixel electrode, an insulating layer between the common electrode and the first pixel electrode; and a voltage wiring connected to the common electrode via a second contact hole different from the first contact hole among the spaced apart two contact holes.

The liquid crystal display may further include one or more contact holes defined in the color filter, different from the spaced apart two contact holes defined in the color filter, the one or more contact holes arranged in a line with the spaced apart two contact holes, and the connecting member may connect the one or more contact holes to any one of the two spaced apart contact holes, such that all of the linearly arranged spaced apart contact holes defined in the color filter are connected to each other.

Another embodiment of the invention provides a method of manufacturing a liquid crystal display including: forming a first switching element on a first substrate; forming a color filter on the first switching element; forming two contact holes spaced apart from each other in the color filter, by exposing a color filter material layer with a mask, the mask including slit patterns at opposing sides of a quadrangular pattern; and forming a first pixel electrode connected to the first switching element via a first contact hole among the spaced apart two contact holes.

A length of a side of the quadrangular pattern of the mask may be greater than about 15 micrometers to less than about 25 micrometers, and the slit pattern is spaced apart from an adjacent quadrangular pattern by an interval of greater than 0.6 micrometer to less than about 1.4 micrometers and has a width of greater than about 0.6 micrometer to less than about 1.4 micrometers.

The exposing a color filter material layer with a mask includes a proximity exposure process.

In the forming two contact holes, three or more contact holes may be defined in the color filter, using a same mask, the same mask used to define the three or more contact holes may include: two or more quadrangular patterns arranged to be spaced apart from each other with a predetermined interval therebetween, and a slit pattern between all adjacent quadrangular patterns among the two or more quadrangular patterns arranged to be spaced apart from each other, and at opposing ends of the two or more arranged quadrangular patterns.

According to one or more embodiment of the invention, in the method of manufacturing the liquid crystal display, the aperture ratio thereof may be improved by reducing the size of the contact hole defined in the color filter.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
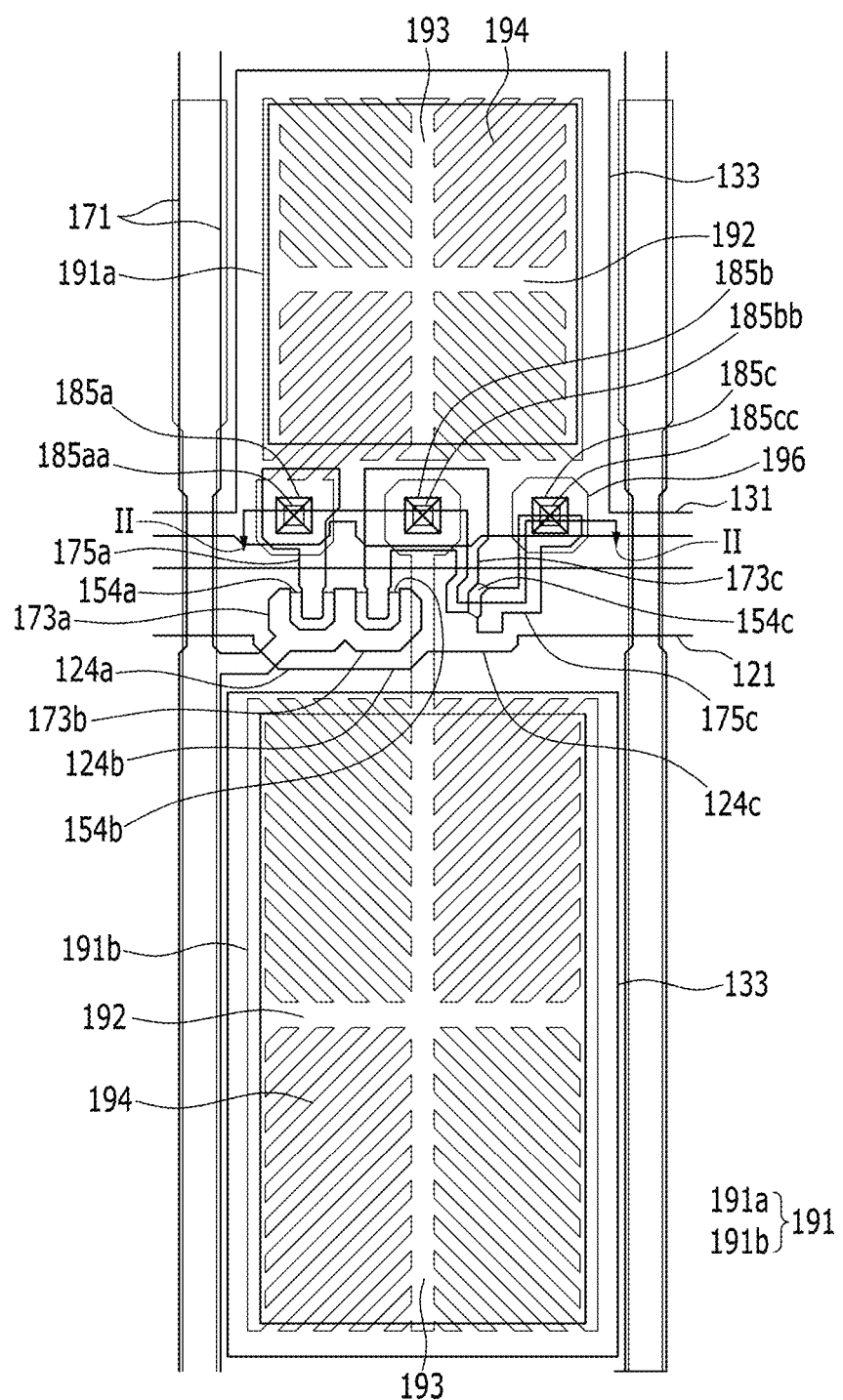
FIG. 1 is a plan view showing an exemplary embodiment of a liquid crystal display according to the invention.

Hereinafter, exemplary embodiments of the invention will be described in detail with reference to the accompanying drawings so that those skilled in the art may easily practice the invention. However, the invention is not limited to the exemplary embodiments which are described herein, and may be modified in various different ways.

Accordingly, the drawings and description are to be regarded as illustrative in nature and not restrictive. Like reference numerals designate like elements throughout the specification In several exemplary embodiments, components having the same configuration will be described representatively in one exemplary embodiment by the same reference numerals. In other exemplary embodiments other than the one exemplary embodiment, only configurations different from those of the one exemplary embodiment will be described.

In addition, since sizes and thicknesses of the respective components shown in the drawings are arbitrarily shown for the convenience of explanation as the thicknesses are exaggerated in order to clearly express several layers and regions in the drawings, the invention is not necessarily limited to those shown in the drawings.

In addition, where a portion is described as a layer, a film, a region, a plate, or the like being "on," "over," and "below" another portion, the portion may be directly on another portion or have another layer interposed therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a liquid crystal display according to the invention will be described with reference to FIGS. 1 to 3.

Figure 2:
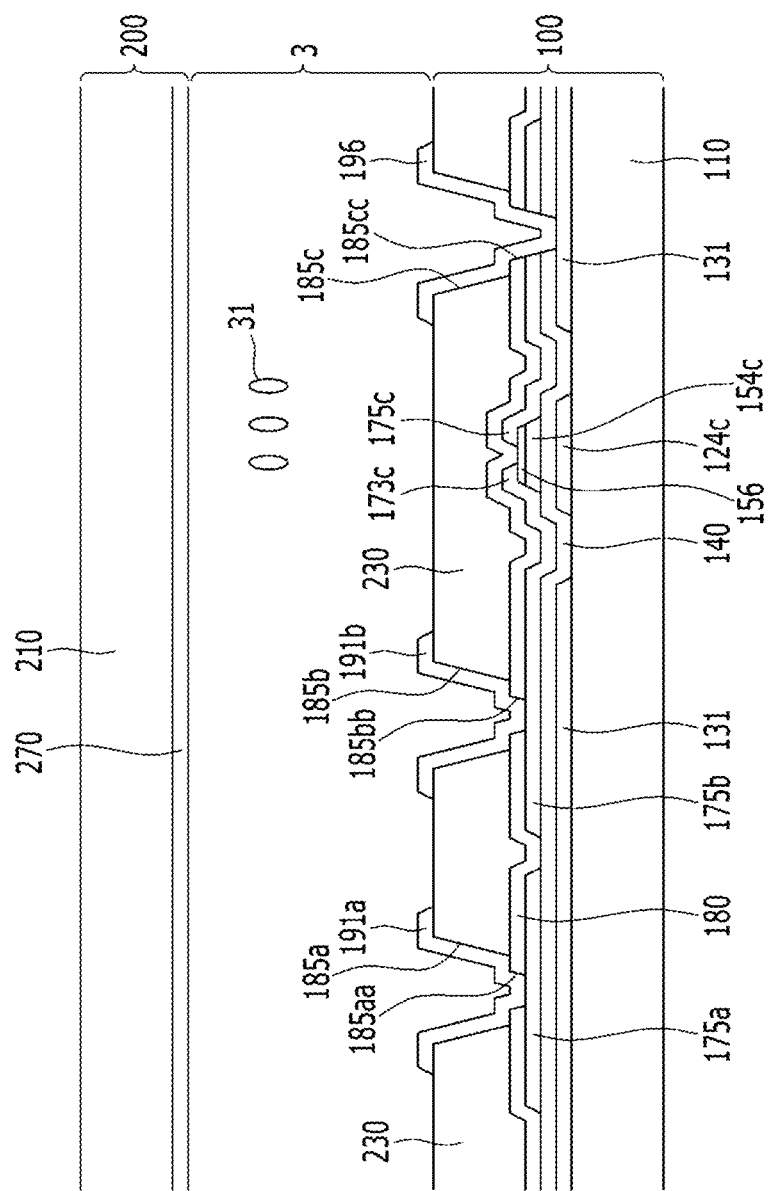
FIG. 2 a cross-sectional view taken along line II-II of the liquid crystal display shown in FIG. 1.
Figure 3:
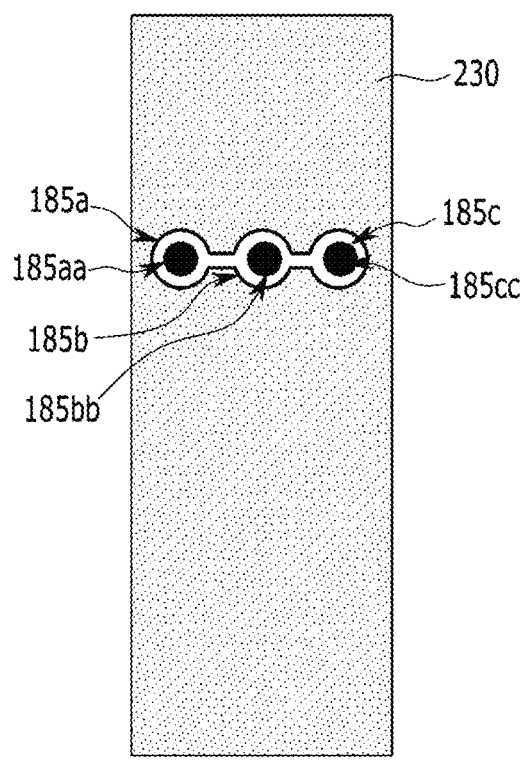
FIG. 3 is a top plan view of an exemplary embodiment of a color filter of the liquid crystal display shown in FIG. 1.

FIG. 1 is a plan view showing an exemplary embodiment of a liquid crystal display according to the invention, FIG. 2 a cross-sectional view taken along line II-II of the liquid crystal display shown in FIG. 1, and FIG. 3 is a top plan view of an exemplary embodiment of a color filter of the liquid crystal display shown in FIG. 1.

The liquid crystal display may include a display area in which an image is displayed and a non-display area in which an image is not displayed. A display area pixel region of the liquid crystal may include a pixel region display area in which the image is displayed and a pixel region non-display area in which the image is not displayed.

Referring to FIGS. 1 to 3, a gate line 121, and a sustaining electrode line 131 which is parallel to the gate line 121, are disposed in one direction on a first substrate 110 of a thin film transistor display panel 100.

The gate line 121 is elongated to mainly extend in a horizontal direction of the plan view and transfers a gate signal. In addition, the gate line 121 is provided with a first gate electrode 124a and a second gate electrode 124b that protrude from a main portion of the gate line 121. In addition, the gate line 121 is provided with a third gate electrode 124c that protrudes from the main portion of the gate line 121 and is disposed so as to be spaced apart from both the first gate electrode 124a and the second gate electrode 124b. The first to third gate electrodes 124a, 124b and 124c are connected to the same gate line 121 and are applied with the same gate signal.

The sustaining electrode line 131 is elongated to extend in the same direction of the gate line 121 and is applied with a predetermined voltage. In addition, the sustaining electrode line 131 is provided with a sustaining electrode 133 that protrudes from a main portion of the sustaining electrode line 131. In the plan view, the sustaining electrode 133 may be disposed so as to surround a pixel electrode 191 to be described below.

A gate insulating layer 140 is disposed on the gate line 121, the first to third gate electrodes 124a, 124b and 124c, the sustaining electrode line 131, and the sustaining electrode 133. The gate insulating layer 140 may include an inorganic insulating material such as silicon nitride (SiNx), silicon oxide (SiOx), or the like. In addition, the gate insulating layer 140 may include a single layer or multiple layers. A 3-1-th contact hole 185cc is defined in the gate insulating layer 140 so as to expose a portion of the sustaining electrode line 131.

A first semiconductor layer 154a, a second semiconductor layer 154b and a third semiconductor layer 154c are disposed on the gate insulating layer 140. The first semiconductor layer 154a may be disposed on the first gate electrode 124a, the second semiconductor layer 154b may be disposed on the second gate electrode 124b, and the third semiconductor layer 154c may be disposed on the third gate electrode 124c.

A data line 171, a first source electrode 173a, a first drain electrode 175a, a second source electrode 173b, a second drain electrode 175b, a third source electrode 173c and a third drain electrode 175c are disposed on the first to third semiconductors 154a, 154b and 154c and on the gate insulating layer 140.

The first to third semiconductor layers 154a, 154b and 154c may be disposed on the first to third gate electrodes 124a, 124b and 124c and may also be disposed below the data line 171.

The data line 171 transfers a data signal and is elongated to mainly extend in a vertical direction of the plan view so as to intersect with the gate line 121.

The first source electrode 173a is disposed so as to be protruded from a main portion of the data line 171 toward the first gate electrode 124a. The first source electrode 173a may have a planar shape curved in a C-shape on the first gate electrode 124a.

The first drain electrode 175a is disposed on the first gate electrode 124a so as to be spaced apart from the first source electrode 173a. A channel is formed by a portion of the first semiconductor layer 154a exposed between the spaced apart first source electrode 173a and first drain electrode 175a.

The second source electrode 173b is disposed so as to be protruded from the main portion of the data line 171 toward the second gate electrode 124b. The second source electrode 173b may have a planar shape curved in a C-shape on the second gate electrode 124b.

The second drain electrode 175b is disposed on the second gate electrode 124b so as to be spaced apart from the second source electrode 173b. A channel is formed by a portion of the second semiconductor layer 154b exposed between the spaced apart second source electrode 173b and second drain electrode 175b.

The third source electrode 175c is connected to the second drain electrode 173b and is disposed on the third gate electrode 124c.

The third drain electrode 175c is disposed on the third gate electrode 124c so as to be spaced apart from the third source electrode 173c. A channel is formed by a portion of the third semiconductor layer 154c exposed between the space apart third source electrode 173c and third drain electrode 175c. The 3-1-th contact hole 185cc is defined in the third drain electrode 175c so as to expose a portion of the sustaining electrode line 131.

The first gate electrode 124a, the first semiconductor layer 154a, the first source electrode 173a and the first drain electrode 175a described above form a first switching element. In addition, the second gate electrode 124b, the second semiconductor layer 154b, the second source electrode 173b and the second drain electrode 175b form a second switching element, and the third gate electrode 124c, the third semiconductor layer 154c, the third source electrode 173c and the third drain electrode 175c form a third switching element. A switching element may otherwise be referred to as a thin film transistor.

A passivation layer 180 is disposed on the data line 171, the first to third source electrodes 173a, 173b and 173c, and the first to third drain electrodes 175a, 175b and 175c. The passivation layer 180 may include an organic insulating material or an inorganic insulating material, and may include a single layer or multiple layers.

In the passivation layer 180 is defined a 1-1-th contact hole 185aa which exposes a portion of the first drain electrode 175a, a 2-1-th contact hole 185bb which exposes a portion of the second drain electrode 175b, and the 3-1-th contact hole 185cc which exposes both the sustaining electrode line 131 and a portion of the third drain electrode 175c.

A color filter 230 is disposed on the passivation layer 180. In an exemplary embodiment including the color filter 230, the passivation layer 180 may be omitted. The color filter 230 may be elongated to extend along a column (e.g., vertical of the plan view) direction of the pixel electrode 191. Each color filter 230 may display one of primary colors such as the three primary colors of red, green and blue. However, the color that the color filter 230 may display is not limited to the three primary colors such as red, green, and blue. In an exemplary embodiment, for example, the color filter may also display one of cyan, magenta, yellow and white.

In the color filter 230 is defined a 1-2-th contact hole 185a coinciding with the 1-1-th contact hole 185aa so as to expose the portion of the first drain electrode 175a exposed by the 1-1-th contact hole 185aa, a 2-2-th contact hole 185b coinciding with the 2-1-th contact hole 185bb so as to expose the portion of the second drain electrode 175b exposed by the 2-1-th contact hole 185bb, and a 3-2-th contact hole 185c coinciding with the 3-1-th contact hole 185cc so as to expose both the sustaining electrode line 131 and the portion of the third drain electrode 175c exposed by 3-1-th contact hole 185cc.

The 1-2-th contact hole 185a, the 2-2-th contact hole 185b and the 3-2-th contact hole 185c defined in the color filter 230 described above are arranged in a line as shown in FIG. 3. The 1-2-th contact hole 185a and the 2-2-th contact hole 185b are connected to each other and the 2-2-th contact hole 185b and the 3-2-th contact hole 185c are connected to each other, so as to form a continuous contact hole in the plan view.

Referring to FIG. 3, the 1-2-th contact hole 185a, the 2-2-th contact hole 185b and the 3-2-th contact hole 185c are connected to each other by a connecting portion such as a groove of a rod shape defined in the color filter 230. The 1-2-th contact hole 185a, the 2-2-th contact hole 185b and the 3-2-th contact hole 185c separately play a role such that the first drain electrode 175a and a first sub-pixel electrode 191a are connected to each other via the 1-2-th contact hole 185a, the second drain electrode 175b and a second sub-pixel electrode 191b are connected to each other via the 2-2-th contact hole 185b, and the sustaining electrode 131 and the third drain electrode 175c are connected to each other via the 3-2-th contact hole 185c. However, since these three contact holes 185a, 185b and 185c are connected to each other by the connecting portion such as the groove of a rod shape as shown in FIG. 3, a single continuous contact hole member is defined in the color filter 230.

FIG. 3 is a top plan view of an exemplary embodiment of a color filter of the liquid crystal display shown in FIG. 1. In the plan view of FIG. 3, the 1-1-th contact hole 185aa, the 2-1-th contact hole 185bb and the 3-1-th contact hole 185cc are completely disposed within the 1-2-th contact hole 185a, the 2-2-th contact hole 185b, and the 3-2-th contact hole 185c connected to each other by the connecting portion such as the groove of the rod shape. The exposed first drain electrode 175a, second drain electrode 175b and sustaining electrode 131 are viewable via the 1-1-th contact hole 185aa, the 2-1-th contact hole 185bb and the 3-1-th contact hole 185cc coinciding with the 1-2-th contact hole 185a, the 2-2-th contact hole 185b and the 3-2-th contact hole 185c connected to each other by the connecting portion such as the groove of the rod shape.

The 1-2-th contact hole 185a, the 2-2-th contact hole 185b and the 3-2-th contact hole 185c as described above each may have a diameter greater than about 5 micrometers (μm) to less than about 12.5 μm. In addition, an interval between the adjacent contact holes among the 1-2-th contact hole 185a, the 2-2-th contact hole 185b and the 3-2-th contact hole 185c may be greater than 0 μm to less than about 10 μm. While FIG. 3 illustrates contact holes having a circular or round shape in the plan view, the shape of the contact hole is not limited thereto or thereby. Referring to FIG. 1, for example, a shape of a contact hole may be rectilinear, and a planar dimension of the contact hole may be referred to as a width or length, rather than a diameter.

A first sub-pixel electrode 191a and a second sub-pixel electrode 191b are disposed on the color filter 230. In addition, a bridge electrode 196 is disposed on the color filter 230. The sub-pixel electrodes 191a and 191b and the bridge electrode 196 are in a same layer of the thin film transistor array display panel 100 among layers disposed on the first substrate 110.

The first sub-pixel electrode 191a is connected to the first drain electrode 175a via first contact holes 185aa and 185a aligned with each other, and the second sub-pixel electrode 191b is connected to the second drain electrode 175b via second contact holes 185bb and 185b aligned with each other. The bridge electrode 196 electrically connects the sustaining electrode line 131 and the third drain electrode 175c to each other via third contact holes 185cc and 185c aligned with each other.

The first sub-pixel electrode 191a and the second sub-pixel electrode 191 b are applied with a data voltage from the first drain electrode 175a and the second drain electrode 175b, respectively. A portion of the data voltage applied to the second drain electrode 175b is divided by the third source electrode 173c, such that magnitude of the voltage of applied to the second sub-pixel electrode 191b is smaller than magnitude of the voltage applied to the first sub-pixel electrode 191a. The voltage of applied to the second sub-pixel electrode 191b is smaller than magnitude of the voltage applied to the first sub-pixel electrode 191a where the data voltage applied to the first sub-pixel electrode 191a and the second sub-pixel electrode 191b has positive polarity (+). Conversely, where the data voltage applied to the first sub-pixel electrode 191a and the second sub-pixel electrode 191b has negative polarity (−), the voltage applied to the first sub-pixel electrode 191a is smaller than the voltage applied to the second sub-pixel electrode 191b.

The second sub-pixel electrode 191b may have an overall planar area one time to two times smaller than that of the first sub-pixel electrode 191a.

The first sub-pixel electrode 191a and the second sub-pixel electrode 191b are adjacent to each other in a column direction (e.g., vertical of the plan view), each having an overall shape of quadrangle. The first sub-pixel electrode 191a and the second sub-pixel electrode 191b may each include a cross stem part including a horizontal stem part 192, and a vertical stem part 193 intersecting with the horizontal stem part 192. In addition, the first sub-pixel electrode 191a and the second sub-pixel electrode 191b are partitioned into four sub-regions by the horizontal stem part 192 and the vertical stem part 193, and each of the sub-regions includes a plurality of fine branch parts 194.

Within a first sub-region from among the defined sub-regions, the first fine branch parts 194 of the first sub-pixel electrode 191a and the second sub-pixel electrode 191b is obliquely extended in a left-upper direction from the horizontal stem part 192 or the vertical stem part 193, and within a second sub-region from among the defined sub-regions, fine branch parts 194 are obliquely extended in a right-upper direction from the horizontal stem part 192 or the vertical stem part 193. In addition, within a third sub-region from among the defined sub-regions, fine branch parts 194 are obliquely extended in a left-lower direction from the horizontal stem part 192 or the vertical stem part 193, and within a fourth sub-region from among the defined sub-regions, fine branch parts 194 are obliquely extended in a right-lower direction from the horizontal stem part 192 or the vertical stem part 193.

Each fine branch part 194 is elongated in an extension direction and forms an angle of approximately 40° to 45° with the gate line 121 or the horizontal stem part 192. Particularly, the fine branch part 194 included in the first sub-pixel electrode 191a may form an angle of approximately 40° with the horizontal stem part 192 and the fine branch part 194 included in the second sub-pixel electrode 191b may form an angle of approximately 45° with the horizontal stem part 192. In addition, the fine branch parts 194 of two neighboring sub-regions among sub-regions of a sub-pixel electrode may be perpendicular to each other.

Next, a counter display panel 200 will be described.

Although not shown, a light blocking member is disposed on a second substrate 210. The light blocking member 220 may also be called a black matrix and may prevent light leakage.

An overcoat (not shown) may also be disposed on the second substrate 210, and both the light blocking member and a common electrode 270 may be disposed on the overcoat.

Polarizers (not shown) may be respectively provided on outer sides of the first substrate 110 and the second substrate 210. Polarization axes of the two polarizers may be perpendicular to each other and one of the polarization axes may be parallel to the gate line 121. In a reflective liquid crystal display, one of the two above-described polarizers may be omitted.

The first sub-pixel electrode 191a and the second sub-pixel electrode 191b to which the data voltage is applied generate an electrical field together with the common electrode 270 of the counter display panel 200 to which the common voltage is applied, so as to determine a direction of liquid crystal molecules 31 of a liquid crystal layer 3 respectively between the two sub-pixel electrodes 191a and 191b, and the common electrode 270. Polarization of light passing through the liquid crystal layer 3 is changed depending on the direction of the liquid crystal molecules 31 determined as described above.

The first and second sub-pixel electrodes 191a and 191b, in cooperation with the common electrode 270, form a liquid crystal capacitor, so as to maintain the applied voltage even after a switching element (e.g., the thin film transistor) is turned off. Sides of the fine branch part 194 distort the electric field, thereby generating horizontal components which are perpendicular to the sides of the fine branch part 194, and inclined directions of the liquid crystal molecules 31 are determined as directions determined by the horizontal components. Therefore, the liquid crystal molecules 31 tend to be initially inclined in directions which are perpendicular to the sides of the fine branch parts 194. However, since the directions of the horizontal components of the electric field by the neighboring sides of adjacent fine branch parts 194 are opposite to each other and since an interval between the adjacent fine branch parts 194 is relatively narrow, the liquid crystal molecules 31 which tend to be inclined in the direction opposite to each other are inclined together in a direction which is parallel to a length (e.g., extension) direction of the fine branch part 194.

In an exemplary embodiment, since the length directions to which the fine branch parts 194 within a sub-pixel are extended in four directions, the directions to which the liquid crystal molecules are inclined are also a total of four directions. As such, where the inclined directions of the liquid crystal molecules 31 are variously implemented within each sub-pixel of a pixel, a reference viewing angle of the liquid crystal display is increased.

Hereinafter, another liquid crystal display according to the invention will be described with reference to FIGS. 4(A), 4(B), 4(C), 5 and 6.

Figure 5:
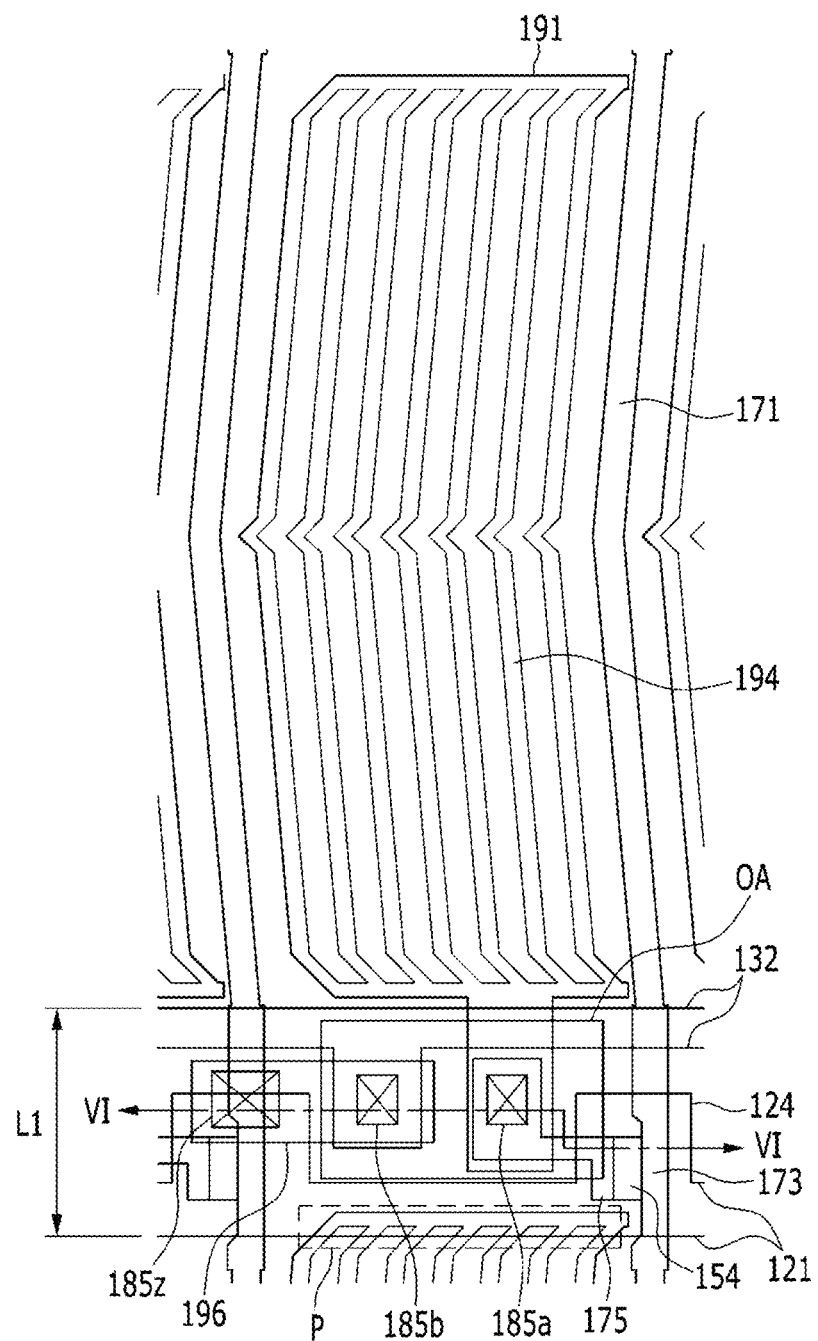
FIG. 5 is a plan view of another exemplary embodiment of a liquid crystal display according to the invention.
Figure 6:
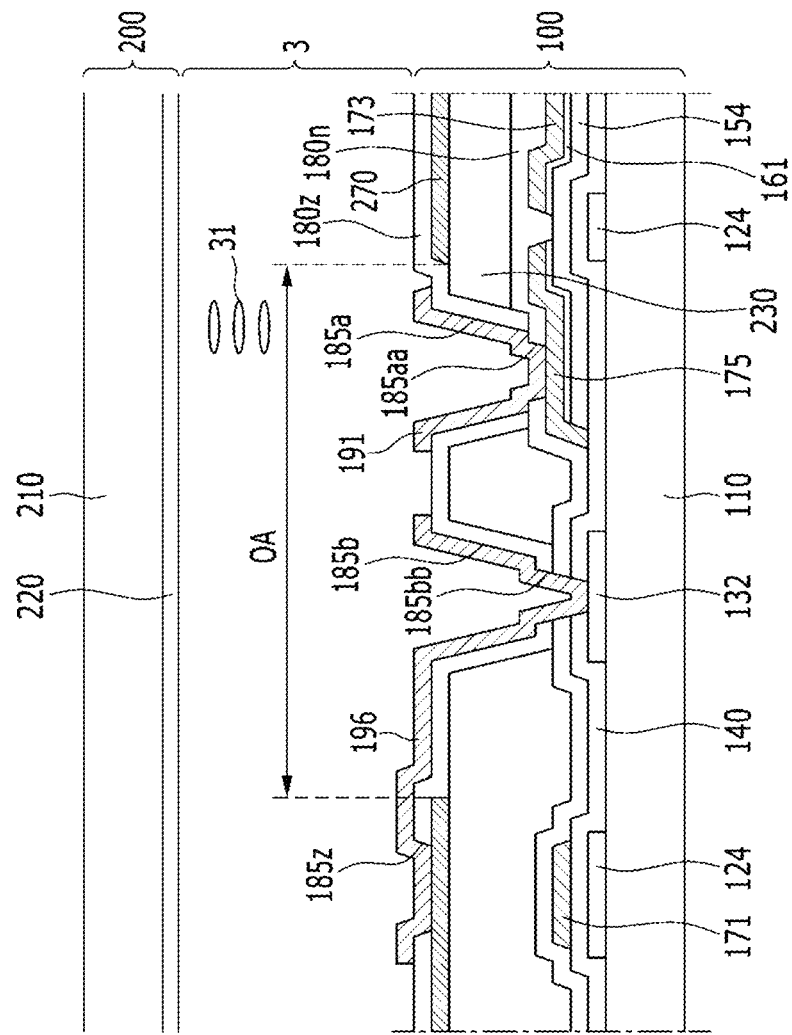
FIG. 6 is a cross-sectional view taken along line VI-VI of the liquid crystal display shown FIG. 5.

FIG. 5 is a plan view of another exemplary embodiment of a liquid crystal display according to the invention and FIG. 6 is a cross-sectional view taken along line VI-VI of the liquid crystal display shown FIG. 5.

Referring to FIGS. 4(A), 4(B), 4(C), 5 and 6, a gate conductor including a gate line 121 and a common voltage line 132 is disposed on a first substrate 110 including transparent glass, plastic, or the like.

The gate line 121 includes a gate electrode 124 and a relatively wide distal end portion (not shown) for connection with other layers or external driving circuits (not shown).

The gate line 121 may include an aluminum (Al) based metal such as aluminum, an aluminum alloy or the like, a silver (Ag) based metal such as silver, a silver alloy or the like, a copper (Cu) based metal such as copper, a copper alloy or the like, a molybdenum (Mo) based metal such as molybdenum, a molybdenum alloy or the like, chromium (Cr), tantalum (Ta), titanium (Ti), and the like. The gate line 121 may have a multilayer structure including at least two conductive layers having different physical properties from each other.

A gate insulating layer 140 including silicon nitride (SiNx), silicon oxide (SiOx), or the like is disposed on the gate conductor. The gate insulating layer 140 may also have a multilayer structure including at least two insulating layers having different physical properties from each other.

Particularly, where the semiconductor layer 154 to be described below includes amorphous silicon, the gate insulating layer 140 may include silicon nitride (SiNx), and where the semiconductor layer 154 is an oxide semiconductor, the gate insulating layer 140 may include sequentially stacked silicon oxide (SiOx) and silicon nitride (SiNx).

A 2-1-th contact hole 185bb exposing a portion of the common voltage line 132 is defined in the gate insulating layer 140.

The common voltage line 132 may be elongated parallel to the gate line 121 and may include the same material as the gate line 121. The common voltage line 132 and the gate line 121 may be in same layer of the thin film transistor array display panel 100 among layers disposed on the first substrate 110. The common voltage line 132 transfers a predetermined common voltage and includes an expansion part protruded from a main portion thereof for connection with the common electrode 270.

The semiconductor layer 154 including amorphous silicon, polycrystal silicon, or the like is disposed on the gate insulating layer 140. The semiconductor layer 154 may include an oxide semiconductor.

An ohmic contact 161 is disposed on the semiconductor layer 154. The ohmic contact may include a material such as n+ hydrogenated amorphous silicon which is relatively heavily doped with n-type impurities such as phosphorus (P), and the like, or may include silicide. The ohmic contact 161 may be disposed in pairs with respect to the semiconductor layer 154. In an exemplary embodiment, where the semiconductor layer 154 is an oxide semiconductor, the ohmic contact 161 may be omitted.

A data conductor is disposed on the ohmic contact 161 and the gate insulating layer 140. The data conductor includes the data line 171 including the source electrode 173, and the drain electrode 175.

The data line 171 includes a relatively wide end portion (not shown) for connection with other layers or external driving circuits (not shown). The data line 171 transfers a data signal and is elongated to mainly extend in a vertical direction of the plan view so as to intersect with the gate line 121.

The data line 171 may have a first curved part having a curved shape in order to obtain maximum transmittance in a pixel region of the liquid crystal display. Curved or inclined parts of the data line 171 intersect or meet with each other at a middle region of the pixel region, to form the curved V-shape of the data line 171. The curved parts meeting at the middle region of the pixel region may form a predetermined angle with each other.

A first curved part among the curved parts of the data line 171 meeting at the middle region of the pixel region may be inclined so as to form angle of about 7 degrees (°) with a vertical reference line (a reference line extended in the vertical direction of the plan view) forming an angle of 90° with a horizontal direction in which the gate line 121 is extended. A second curved part among the curved parts of the data line 171 meeting at the middle region of the pixel region may be inclined so as to form an angle of about 7° to 15° with the first curved part.

The source electrode 173 is a portion of the data line 171 and is disposed on the same extension line as the data line 171. A portion of the drain electrode 175 is disposed so as to be extended to be parallel to the source electrode 173. Therefore, the portion of the drain electrode 175 is parallel to the portion of the data line 171.

The gate electrode 124, the source electrode 173 and the drain electrode 175 form one thin film transistor ("TFT") together with the semiconductor layer 154, and a channel of the TFT is formed by a portion of the semiconductor layer 154 exposed between the source electrode 173 and the drain electrode 175.

The data line 171 and the drain electrode 175 may include a refractory metal such as molybdenum, chromium, tantalum, titanium and the like, or an alloy thereof, and may have a multilayer structure including a refractory metal layer (not shown) and a low resistance conductive layer (not shown). Examples of the multilayer structure of the data line 171 and the drain electrode 175 may include a double layer of a chromium or molybdenum (alloy) lower layer and an aluminum (alloy) upper layer and a triple layer of a molybdenum (alloy) lower layer, an aluminum (alloy) middle layer, and a molybdenum (alloy) upper layer. However, the data line 171 and the drain line 175 may include various metals or conductors, in addition to those described above.

The data line 171 has a length in an extension direction thereof, and a width taken perpendicular to the extension direction. The data line 171 may have a width of about 3.5 μm±0.75 μm.

A first passivation layer 180n is disposed on exposed portions of the data conductors 171, 173 and 175, on the gate insulating layer 140, and on the semiconductor layer 154. The first passivation layer 180n may include an organic insulating material, an inorganic insulating material or the like.

Particularly, where the semiconductor layer 154 includes amorphous silicon, the first passivation layer 180n may include silicon nitride (SiNx), and where the semiconductor layer 154 includes an oxide semiconductor, the first passivation layer 180n may include sequentially stacked silicon nitride (SiNx) and silicon oxide (SiOx).

A 1-1-th contact hole 185aa exposing a portion of the drain electrode 175 and the 2-1-th contact hole 185bb exposing a portion of the common voltage line 132 are defined in the first passivation layer 180n.

A color filter 230 is disposed on the first passivation layer 180n. The color filter 230 may be elongated to extend to be long along a column (e.g., vertical of the plan view) of the pixel electrode 191. Each color filter 230 may display one of primary colors such as the three primary colors of red, green and blue. However, the color that the color filter 230 may display is not limited to the three primary colors such as red, green, and blue. In an exemplary embodiment, for example, the color filter may also display one of cyan, magenta, yellow and white.

In the color filter 230 is defined, the 1-2-th contact hole 185a coinciding with the 1-1-th contact hole 185aa so as to expose the portion of the drain electrode 175 exposed by the 1-1-th contact hole 185aa, and the 2-2-th contact hole 185b coinciding with the 2-1-th contact hole 185b so as to expose the portion of the common voltage line 132 exposed by the 2-1-th contact hole 185bb.

Figure 4A:
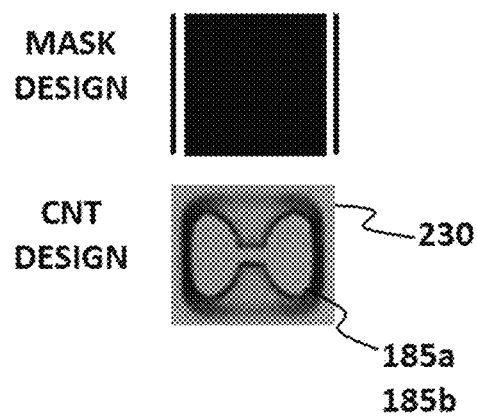
FIGS. 4(A), 4(B) and 4(C) are views showing exemplary embodiments of a mask design used in a method of manufacturing a liquid crystal display according to the invention and corresponding contact hole designs formed therefrom.

The 1-2-th contact hole 185a and the 2-2-th contact hole 185b defined in the color filter 230 as described above are arranged in a line such as illustrated in a design of two contact holes ("CNTs") of FIG. 4A and are connected to each other by a connecting portion such as a groove of a rod shape defined in the color filter 230.

The 1-2-th contact hole 185a and the 2-2-th contact hole 185b separately play a role such that the drain electrode 175 and the pixel electrode 191 are connected to each other via the 1-2-th contact hole 185a and the common voltage line 132 and the bridge electrode 196 are connected to each other via the 2-2-th contact hole 185b. However, since the two contact holes are connected to each other by the connecting portion such as the groove of a rod shape as shown in FIG. 4A, the contact holes defined in the color filter 230 form a single continuous contact hole member defined in the color filter 230.

The 1-2-th contact hole 185a and the 2-2-th contact hole 185b as described above each may have a diameter of greater than about 5 μm to less than about 12.5 μm. In addition, an interval between adjacent contact holes among the 1-2-th contact hole 185a and the 2-2-th contact hole 185b may be greater than 0 μm to less than about 10 μm.

Within the TFT array display panel 100, a common electrode 270 is disposed on the color filter 230. The common electrode 270, which is a planar shape, may be disposed on a front surface of the first substrate 110 as a substantially continuous plate. An opening region OA disposed in a corresponding region around the drain electrode 175. The opening region OA included in the common electrode 270 has a rectangular shape.

Within the TFT array display panel 100, a second passivation layer 180z is disposed on the common electrode 270. The second passivation layer 180z may include an organic insulating material, an inorganic insulating material or the like. The 1-1-th contact hole 185aa, the 2-2-th contact hole 185bb, and a common electrode contact hole 185z are defined in the second passivation layer 180z.

First contact holes 185aa and 185a and second contact holes 185bb and 185b are disposed within the opening region OA of the common electrode 270, and the common electrode contact hole 185z is disposed outside the opening region OA of the common electrode 270. In addition, the first contact holes 185aa and 185a, the second contact holes 185bb and 185b, and the common electrode contact hole 185z are disposed so as to be arranged in a line extended parallel to the gate line 121.

The pixel electrode 191 and the bridge electrode 196 are formed on the second passivation layer 180z so as to be electrically separated from each other. The pixel electrode 191 and the bridge electrode 196 include a same material and may be formed by a simultaneous process. The pixel electrode 191 and the bridge electrode 196 are in a same layer of the TFT array display panel 100 among layers disposed on the first substrate 110.

The pixel electrode 191 includes a curved edge which is substantially parallel to the first curved part and the second curved part of the data line 171. The pixel electrode 191 has defined therein a plurality of first cutout parts which defines a plurality of branch electrodes 194.

The pixel electrode 191 is physically and electrically connected to the drain electrode 175 of a TFT through the first contact holes 185aa and 185a and is applied with a voltage from the drain electrode 175.

The bridge electrode 196 electrically connects the common electrode 270 and the common voltage line 132 on the second passivation layer 180z to each other. More specifically, the bridge electrode 196 is in contact with the common voltage line 132 via the second contact holes 185bb and 185b and is in contact with the common electrode 270 through the common electrode contact hole 185z.

That is, the common electrode 270 may receive a common voltage having predetermined magnitude from the common voltage line 132 via the bridge electrode 196.

Referring to FIG. 5, since the bridge electrode 196 is formed to be elongated in a horizontal direction of the which is parallel to the gate line 121 in the plan view, a vertical direction width L1 of a pixel non-display region blocked by a black matrix (not shown) is reduced, thereby making it possible to improve an aperture ratio.

In addition, since the bridge electrode 196 connecting the common electrode 270 and the common voltage line 132 to each other is not formed to be elongated in the vertical direction, but is formed to be elongated in the horizontal direction, a size of the pixel electrode 191 may be increased in the vertical direction by forming the pixel electrode 191 so as to be partially overlapped with the gate line 121 at region P, thereby making it possible to improve transmittance.

Hereinafter, a method of manufacturing a liquid crystal display according to the invention will be described with reference to FIGS. 1 to 6.

Figure 4B:
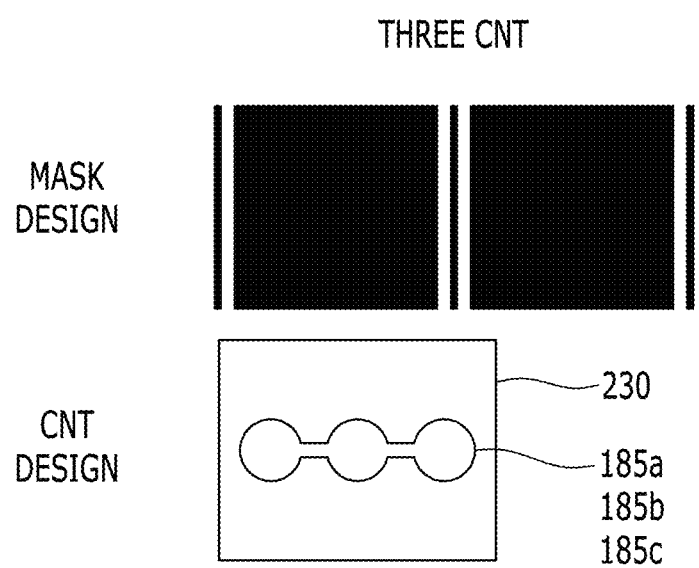
Figure 4C:
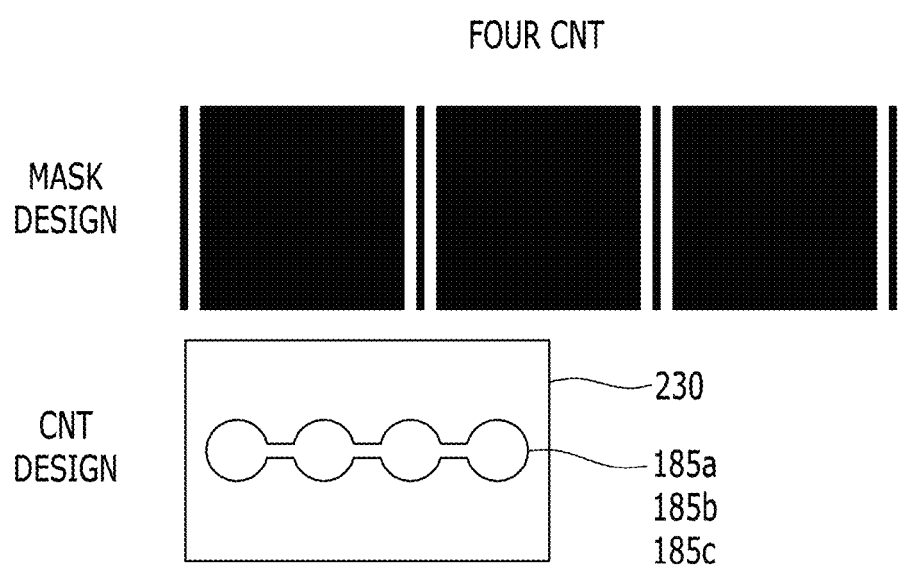

FIGS. 4(A), 4(B) and 4(C) are views showing exemplary embodiments of a mask design used in a method of manufacturing a liquid crystal display according to the invention and corresponding contact hole designs formed therefrom.

In FIGS. 4(A), 4(B) and 4(C), the term "CNT" means "contact hole" and a portion indicated by black in a mask design means a pattern having a minimum gray scale. In the mask design, except for the black pattern, remaining portions indicate a pattern having a maximum gray scale.

Hereinafter, an exemplary embodiment of a method of manufacturing a liquid crystal display shown in FIGS. 1 to 3 described above will be described with reference to FIGS. 1 to FIGS. 4(A), 4(B) and 4(C).

The gate line 121, and the sustaining electrode line 131 parallel to the gate line 121 while being electrically separated from the gate line 121, are formed (e.g., provided) elongated in one direction on the first substrate 110. The gate insulating layer 140 is formed on the gate line 121. A first semiconductor layer 154a, a second semiconductor layer 154b and a third semiconductor layer 154c are formed on the gate line 121. In addition, the data line 171 intersecting with the gate line 121, the first source electrode 173a and the first drain electrode 175a that are connected to the first semiconductor layer 154a, the second source electrode 173b and the second drain electrode 175b that are connected to the second semiconductor layer 154b, and the third source electrode 173c and the drain electrode 175c that are connected to the third semiconductor layer 154c, are formed on the first substrate 110. The passivation layer 180 is formed on the data line 171, the first to third source electrodes 173a, 173b and 173c, and the first to third drain electrodes 175a, 175b and 175c.

The 1-1-th contact hole 185aa exposing the portion of the first drain electrode 175a and the 2-1-th contact hole 185bb exposing the portion of the second drain electrode 175b are formed in the passivation layer 180, and the 3-1-th contact hole 185cc exposing a portion of the sustaining electrode line 131 is formed in the gate insulating layer 140, in the third drain electrode 175c and in the passivation layer 180 such as by using a projecting exposure. Since shapes of the respective constituent elements may reference the description described above with respect to FIGS. 1 to 3, a detailed description thereof will be omitted.

The color filter 230 is formed on the passivation layer 180. A material for forming the color filter includes a photosensitive material having property in which an entirety thereof is removed except for an exposed portion thereof. After the material for forming the color filter 230 is provided, the 1-2-th contact hole 185a, the 2-2-th contact hole 185b and the 3-2-th contact hole 185c are formed in the color filter 230 such as by a proximity exposure of the material for forming the color filter 230. The 1-2-th contact hole 185a is formed so as to be matched to an upper portion of the 1-1-th contact hole 185aa, the 2-2-th contact hole 185b is formed so as to be matched to an upper portion of the 2-1-th contact hole 185bb, and the 3-2-th contact hole 185c is formed so as to be matched to an upper portion of the 3-1-th contact hole 185cc.

The 1-2-th contact hole 185a, the 2-2-th contact hole 185b and the 3-2-th contact hole 185c are simultaneously formed by using a design of three CNT masks shown in FIG. 4(B). A three CNT mask design is formed by connecting quadrangular patterns while having a predetermined interval therebetween, by forming one slit pattern between the quadrangular patterns, and by disposing one slit pattern at left and right sides of the connected quadrangular pattern. Once the proximity exposure is performed in a state in which the above-described three CNT mask design is applied to the material for forming the color filter 230, the 1-2-th contact hole 185a, the 2-2-th contact hole 185b and the 3-2-th contact hole 185 are simultaneously formed in a line as illustrated by the CNT design shape below the three CNT mask design in FIG. 4(B). During a process in which the 1-2-th contact hole 185a, the 2-2-th contact hole 185b and the 3-2-th contact hole 185c are formed, the 1-2-th contact hole 185a, the 2-2-th contact hole 185b and the 3-2-th contact hole 185c may be connected to each other by a connecting portion such as a groove of a rod shape as shown in FIG. 4(B).

In the three CNT mask design, the quadrangular pattern may be a square pattern where a length of a side is greater than about 15 μm and less than about 25 μm. The slit pattern may be spaced apart from the square pattern by an interval of greater than about 0.6 μm to less than about 1.4 μm and may have a thickness or width taken perpendicular to an extension direction thereof of greater than about 0.6 μm to less than about 1.4 μm. In an exemplary embodiment, for example, the quadrangular pattern may be the square pattern having the side length of about 25 μm and the slit pattern spaced apart from the square pattern by an interval of about 1 μm, the slit pattern having the thickness of about 1 μm.

Where mask design having the sizes described above is used, the 1-2-th contact hole 185a, the 2-2-th contact hole 185b and the 3-2-th contact hole 185c may be formed so as to each have a diameter of greater than about 5 μm to less than about 12.5 μm, with intervals between the 1-2-th contact hole 185a and the 2-2-th contact hole 185b, and between the 2-2-th contact hole 185b and the 3-2-th contact hole 185c being greater than 0 μ to less than about 10 μm.

Next, an exemplary embodiment of a method of manufacturing the liquid crystal display shown in FIGS. 5 and 6 described above will be described with reference to FIGS. 4(A), 4(B), 4(C), 5 and 6. Since shapes and stacked structures of other constituent elements may reference the description described above with respect to FIGS. 5 and 6, a detailed description thereof will be omitted.

The 1-2-th contact hole 185a and the 2-2-th contact hole 185b are formed in the color filter 230 stacked on the first passivation layer 180n such as by the proximity exposure of the material for forming the color filter 230. The 1-2-th contact hole 185a is formed so as to be matched to the upper portion of the 1-1-th contact hole 185aa and the 2-2-th contact hole 185b is formed so as to be matched to the upper portion of the 2-1-th contact hole 185bb. The 1-2-th contact hole 185a and the 2-2-th contact hole 185b are simultaneously formed by using a mask design of two CNT masks shown in FIG. 4(A). A two CNT mask design is formed by disposing one slit pattern at left and right sides of one quadrangular pattern. Once the proximity exposure is performed in a state in which the above-described two CNT mask design is applied to the material for forming the color filter 230, the 1-2-th contact hole 185a and the 2-2-th contact hole 185b are simultaneously formed in a line as illustrated by the CNT design shape below the two CNT mask design of FIG. 4(A). During a process in which the 1-2-th contact hole 185a and the 2-2-th contact hole 185b are formed, the 1-2-th contact hole 185a and the 2-2-th contact hole 185b may be connected to each other by a connecting portion such as the groove of a rod shape as shown in FIG. 4(A).

In the two CNT mask design, the quadrangular pattern may be a square pattern having a side length greater than about 15 μm to less than about 25 μm. The slit pattern may be spaced apart from the square pattern by an interval of greater than about 0.6 μm to less than about 1.4 μm and may have a thickness taken perpendicular to an extension direction thereof great than about 0.6 μm to less than about 1.4 μm. In an exemplary embodiment, the quadrangular pattern may be the square pattern having the side length of about 25 μm and the slit pattern may be spaced apart from the square pattern by an interval of about 1 μm, the slit pattern having the thickness of about 1 μm.

Where the mask design having the sizes described above is used, the 1-2-th contact hole 185a and the 2-2-th contact hole 185b may be formed so as to each have a diameter of greater than about 5 μm to less than about 12.5 μm, with intervals between the 1-2-th contact hole 185a and the 2-2-th contact hole 185b being greater than 0 μm to less than about 10 μm.

According to a Comparative Example, a contact hole is formed in the color filter of a liquid crystal display, by performing proximity exposure in a state in which a mask design including the square pattern is applied to the material for forming the color filter. In the proximity exposure, since the material for forming the color filter and the mask are disposed so as to be spaced apart from each other by a predetermined interval without being closely adhered to each other, a difference between the size of the mask and the size of the generated contact hole occurs at the time of the exposure. According to the Comparative Example using the square pattern mask having the side length of 35 μm, when the exposure is performed in a state in which the mask is put at a position spaced apart from the material for forming the color filter, the material to be exposed having a thickness of about 3 μm, by an interval of 300 μm, one contact hole having a size of 22 μm is formed. That is a mask design of the size 35 μum forms a contact hole of the sixe 22 μm. In addition, according to the Comparative Example using the square pattern mask having the side length of 25 μm, the contact hole is not properly formed as evidenced by the large difference between the size of the mask and the size of the generated contact hole.

According to one or more exemplary embodiment of the invention, unlike the Comparative Example, two contact holes each having the size of less than about 12.5 μm may be formed by using a mask having one square pattern having a side length of about 25 μm, with slit patterns having a thickness of about 1 μm formed at left and right of the square pattern and spaced apart therefrom by an interval of about 1 μm.

The upper view MASK DESIGN for the two CNTs (TWO CNT) of FIG. 4(A) schematically show the mask used for the above-described exemplary embodiment, while the lower view CNT DESIGN of the two CNTs of FIG. 4(A) is an actual photograph of the contact holes 185a and 185b which are formed by using the two CNTs mask design.

According to the mask shown in FIG. 4(A), the contact hole may be properly formed even using the mask having the size of about 25 μm as compared to Comparative Example in which the contact hole is not properly formed, and the two contact holes 185a and 185b in FIG. 4(A) may be properly formed by one mask. Therefore, in one more exemplary embodiment, the contact hole having the size of less than about 12.5 μm which is smaller than that of the Comparative Example, may be formed.

Since in a liquid crystal display, a contact hole is designed to have greater than a predetermined size in order to provide contact between electrodes disposed in layers on (e.g., above) and below the layer in which the contact hole is defined, the contact hole formed by one or more exemplary embodiment of a method of manufacturing a liquid crystal display according to the invention to have the diameter of more than about 5 μm to less than about 12.5 μm. In addition, since at least two contact holes may be formed by one mask as in the design of the two CNTs of FIG. 4(A), an interval of the contact holes may be formed so as to be greater than 0 μm to less than about 10 μm, which is a narrower range than that formed in the Comparative Example. In one or more exemplary embodiment according to the invention, the slit pattern added to a region in which the contact hole is not formed or to a region in which a minimum portion of the contact hole is formed causes destructive interference for light passing through the slit pattern so that the above-mentioned relatively small contact hole may be properly formed even using a single mask.

Once the size of each contact hole and the interval between adjacent contact holes is reduced as described above, a size of the light blocking member in a pixel non-display area near the gate line at which the contact hole is formed is also reduced, thereby making it possible to improve transmittance of the liquid crystal display.

In the Comparative Example, at most three contact holes may be formed around the gate line due to the difference between the size of the mask and the size of the generated contact hole. In contrast, when one or more exemplary embodiment of the mask according to the invention illustrated in FIGS. 4(A) to 4(C) is used, the number of contact holes that may be formed around the gate line may be increased.

Referring to FIG. 4(C), a four CNT mask design is formed by connecting three square patterns while having a predetermined interval therebetween, by forming one slit pattern having a predetermined thickness between the connected square patterns while having a predetermined interval therebetween, and by forming one slit pattern having a predetermined thickness at left and right ends of the connected square pattern while having a predetermined interval therebetween. Once the proximity exposure is performed in a state in which the above-described four CNT mask design is applied to the material for forming the color filter 230, four contact holes 185a, 185b, 185c and 185d may be formed as illustrated in the CNT design of for four CNTs of FIG. 4(C).

The invention is not limited to the exemplary embodiments shown in FIGS. 4(A), 4(B) and 4(C), such that five or more contact holes may be formed by using a single mask including four or more square patterns connected to each other.

In addition, the invention is not limited to the exemplary embodiments of FIGS. 1 to 6, and may include any of a number of display device structures in which two or more contact holes are defined in a material layer such as the material layer for forming the color filter, regardless a kind and structure of the liquid crystal display.

In addition, where the color filter is formed from a photosensitive material having a material property in which an entire portion thereof is removed except for the portion which is not exposed in an exposure process, the mask designs as shown in FIGS. 4(A), 4(B) and 4(C) as well as mask designs in which the maximum gray scale and the minimum gray scale portions are inverted, may be used.

In the specification, although the terms "sustaining electrode line" or "common voltage line" are used, these names may be comprehensively designated as a voltage wiring. In addition, the voltage wiring is not limited to the sustaining electrode line and the common voltage line. The term voltage wiring may include any of a number of conductive wiring and/or signal transferring lines which apply or transfer a voltage such as to a pixel, are included in the scope of the invention.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
    a first substrate;
    a gate line on the first substrate;
    a first switching element connected to the gate line, to which a data voltage is applied;
    a first pixel electrode connected to the first switching element; and
    a color filter between the first switching element and the first pixel electrode,
    wherein
    the color filter comprises at least two contact holes arranged in a line,
    the at least two contact holes includes a first contact hole and a second contact hole spaced apart from each other, and
    the first contact hole and the second contact hole are connected to each other through a connecting portion defined in the color filter, and
    the first pixel electrode is connected to the first switching element via the first contact hole.

2. The liquid crystal display of claim 1, wherein:
    a width of each of the spaced apart first and second contact holes is greater than about 5 micrometers to less than about 12.5 micrometers.

3. The liquid crystal display of claim 1, wherein:
    an interval between the first and second contact holes is greater than 0 micrometer to less than about 10 micrometers.

4. The liquid crystal display of claim 3, wherein:
    a width of each of the first and second contact holes is greater than about 5 micrometers to less than about 12.5 micrometer.

5. The liquid crystal display of claim 1, further comprising:
    a second switching element applied with the same data voltage as the first switching element applies; and
    a second pixel electrode connected to the second switching element,
    wherein the second pixel electrode is connected to the second switching element via the second contact hole.

6. The liquid crystal display of claim 4, further comprising:
    a second switching element applied with the same data voltage as the first switching element applies; and
    a second pixel electrode connected to the second switching element,
    wherein the second pixel electrode is connected to the second switching element via the second contact hole.

7. The liquid crystal display of claim 5, further comprising:
    a third switching element connected to the second switching element; and
    a voltage wiring connected to the third switching element;
    wherein
    the at least two contact holes further include a third contact hole arranged in the line and spaced apart from the first and second contact holes,
    the third switching element is connected to the voltage wiring via the third contact hole, and
    the third contact hole is connected to the first or second contact hole through another connecting portion defined in the color filter.

8. The liquid crystal display of claim 7, wherein:
a width of each of the first to third contact holes is greater than about 5 micrometers to less than about 12.5 micrometers.

9. The liquid crystal display of claim 7, wherein:
an interval between adjacent contact holes among the first to third contact holes is greater than 0 micrometer to less than about 10 micrometers.

10. The liquid crystal display of claim 9, wherein:
a width of each of the first to third contact holes is greater than about 5 micrometers to less than about 12.5 micrometers.

11. The liquid crystal display of claim 1, further comprising:
a common electrode overlapped with the first pixel electrode;
an insulating layer between the common electrode and the first pixel electrode; and
a voltage wiring connected to the common electrode via the second contact hole.

12. The liquid crystal display of claim 11, wherein:
a width of each of the first and second contact holes is greater than about 5 micrometers to less than about 12.5 micrometers.

13. The liquid crystal display of claim 11, wherein:
an interval between the first and second contact holes is greater than 0 micrometer to less than about 10 micrometers.

14. The liquid crystal display of claim 1, wherein:
the connecting portion extends substantially parallel to the line.

* * * * *